(12) United States Patent
Gupta et al.

(10) Patent No.: US 11,646,741 B2
(45) Date of Patent: May 9, 2023

(54) PULSE WIDTH MODULATOR WITH REDUCED PULSE WIDTH

(71) Applicant: STMICROELECTRONICS INTERNATIONAL N.V., Geneva (CH)

(72) Inventors: Prashutosh Gupta, Ballia (IN); Ankit Gupta, Delhi (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 0 days.

(21) Appl. No.: 17/931,043

(22) Filed: Sep. 9, 2022

(65) Prior Publication Data
US 2023/0006679 A1 Jan. 5, 2023

Related U.S. Application Data

(63) Continuation of application No. 17/525,680, filed on Nov. 12, 2021, now Pat. No. 11,451,233.

(60) Provisional application No. 63/116,473, filed on Nov. 20, 2020.

(51) Int. Cl.
*H03L 7/081* (2006.01)
*H03L 7/085* (2006.01)

(52) U.S. Cl.
CPC ............ *H03L 7/0812* (2013.01); *H03L 7/085* (2013.01)

(58) Field of Classification Search
CPC ............................. H03L 7/0812; H03L 7/085
See application file for complete search history.

(56) References Cited

U.S. PATENT DOCUMENTS

| 5,638,017 | A | 6/1997 | Kim | |
|---|---|---|---|---|
| 6,067,267 | A * | 5/2000 | Lo | G11C 7/1051 365/221 |
| 6,435,037 | B1 * | 8/2002 | Doten | A61B 8/06 73/861.27 |
| 6,998,928 | B2 | 2/2006 | Stengel et al. | |
| 7,554,372 | B1 | 6/2009 | Wong | |
| 7,593,500 | B2 | 9/2009 | Kris | |
| 7,673,095 | B2 * | 3/2010 | Artieri | G11C 11/419 710/52 |
| 8,183,902 | B2 | 5/2012 | Kenly et al. | |
| 8,396,111 | B2 | 3/2013 | O'Malley et al. | |
| 11,100,963 | B1 * | 8/2021 | Wu | G06F 5/06 |

(Continued)

FOREIGN PATENT DOCUMENTS

CN 101465633 A 6/2009

*Primary Examiner* — Adam D Houston
(74) *Attorney, Agent, or Firm* — Seed IP Law Group LLP

(57) ABSTRACT

An integrated circuit includes a pulse width modulator. The pulse width modulator includes a multiplexer that receives a plurality of data delay signals. Each of the data delay signals is based on a data signal and a respective clock phase signal. The multiplexer includes a first multiplexer stage and a second multiplexer stage. The first multiplexer stage receives all of the data delay signals and has a relatively large delay. The second multiplexer stage receives to output signals from the first multiplexer stage and has a relatively small delay. The second multiplexer stage outputs a pulse width modulation signal that can have a pulse width corresponding to the offset between two adjacent clock phase signals.

20 Claims, 5 Drawing Sheets

(56) References Cited

U.S. PATENT DOCUMENTS

| | | | |
|---|---|---|---|
| 2004/0027207 A1* | 2/2004 | Yin | H03L 7/099 331/16 |
| 2005/0080975 A1* | 4/2005 | Elledge | G06F 13/4027 710/316 |
| 2006/0210006 A1* | 9/2006 | Sareen | H03K 5/135 375/376 |
| 2013/0147533 A1* | 6/2013 | Ding | H03K 7/08 327/172 |
| 2014/0240020 A1* | 8/2014 | Kris | H02M 1/08 327/241 |
| 2016/0269016 A1* | 9/2016 | Kris | H02M 1/08 |
| 2019/0068202 A1* | 2/2019 | Eimitsu | H03L 7/085 |
| 2021/0226612 A1* | 7/2021 | Grout | H03K 19/20 |
| 2022/0083011 A1* | 3/2022 | Gu | G04F 10/005 |
| 2022/0166435 A1* | 5/2022 | Gupta | H03L 7/085 |

\* cited by examiner

PULSE WIDTH MODULATOR WITH REDUCED PULSE WIDTH

BACKGROUND

Technical Field

The present disclosure is related to integrated circuits, and more particularly to integrated circuits with pulse width modulators.

Description of the Related Art

Pulse width modulators are used to generate pulses of variable width. To do this, the rising edge of a data pulse is delayed by a different amount than the delay on the falling edge. To achieve this, a phase locked loop can be used to create phase signals from a clock signal which can be used to delay the data edges precisely. By controlling the delay on the positive and the negative edge, pulse width modulation can be achieved.

In some cases, it is desirable to have very small pulse width at the output of the pulse width modulator. The width of the pulse may need to be the size of a single unit step, where the unit step is the period of the clock signal divided by the number of phase signals generated from the clock signal. This can be difficult to achieve.

BRIEF SUMMARY

A pulse width modulator in accordance with principles of the present disclosure is able to provide pulses with very small widths. The pulse width modulator includes a multiplexer that includes multiple stages. The multiplexer is designed so that the final output stage has a very small delay compared with the preceding stages. The preceding stages collectively have a large delay but are balanced so their output signals arrive at the final stage with a same delay. The pulse width modulator can output pulses with widths as small as the very small delay of the final multiplexer stage.

The pulse width modulator generates N phase signals from a clock signal. Each phase signal has the same period T as the clock signal but is delayed from the clock signal by a respective number of unit steps ranging from 0 unit steps to N−1 unit steps, where a unit step has a value equal to T/N. When a data signal is received by the pulse width modulator, the pulse width modulator generates N data delay signals each corresponding to one of the phase signals. Each data delay signal matches the data signal but is delayed by the number of unit steps corresponding to the associated phase signal. In one embodiment, each data delay signal is delayed by the number of unit steps plus one clock cycle.

Half of the data delay signals are received by a first substage of the multiplexer. The other half of the data delay signals are received by a second substage of the multiplexer. The first and second substages correspond to the first stage of the multiplexer. Each substage provides one of the data delay signals to the final stage. The first and second substages have identical delays. The final substage outputs a pulse having a width based on the rising and falling edges of the outputs of the first stage. The final stage has a delay that is smaller than a single unit step. This enables the multiplexer to output a pulse with a width equal to a single unit step.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as, "comprises" and "comprising" are to be construed in an open, inclusive sense, that is, as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

Figure 1A:
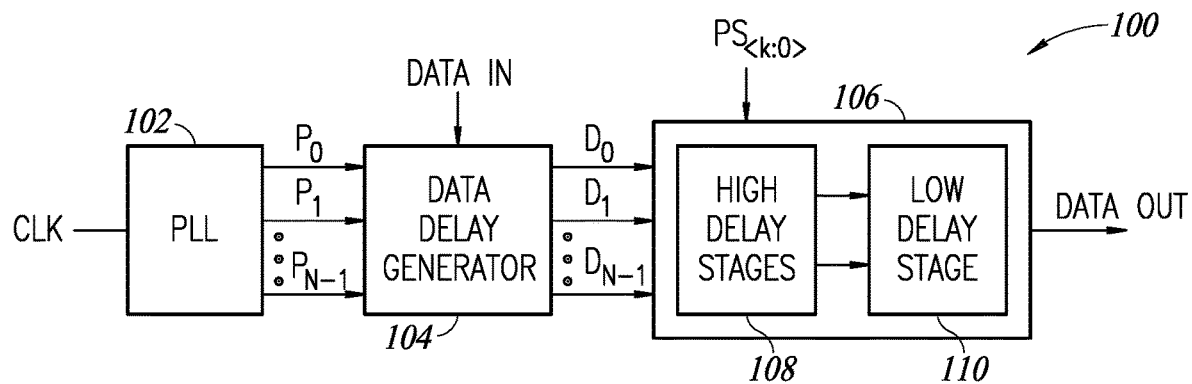
FIG. 1A is a block diagram of a pulse width modulator, according to one embodiment.

FIG. 1A is a block diagram of a pulse width modulator 100, according to one embodiment. The pulse width modulator 100 is configured to receive an input data signal (DATA IN) and to generate an output data signal (DATA OUT). The output data signal is a pulse having a width that represents the value of the input data signal. As is set forth in more detail below, the pulse width modulator 100 is able to generate a data output pulse having a very small pulse width.

The pulse width modulator 100 includes a phase locked loop 102. The phase locked loop 102 receives a clock signal CLK. The clock signal CLK has a frequency f and period T. The clock signal CLK can include a square wave form having rising and falling edges.

The pulse width modulator 100 receives the clock signal CLK and generates N phase signals $P_0$-$P_{N-1}$, where N is an integer. Each of the phase signals has the same form, frequency, and period of the clock signal CLK. Accordingly, the phase signals can be considered clock signals in form and function. Each of the phase signals is delayed from the clock signal by an integer number of unit steps. A single unit step has a value of T/N. The phase signal $P_0$ is delayed by 0 unit steps and thus has no delay from the clock signal CLK. The phase signal $P_1$ is delayed from the clock signal by a single unit step. The phase signal $P_2$ is delayed from the clock signal by two unit steps. The final phase signal, $P_{N-1}$ is delayed from the clock signal by N−1 unit steps. As an illustrative example, the phase signal $P_1$ is delayed by a single unit step. This means that the rising edge of the phase signal $P_1$ is delayed from the rising edge of the clock signal CLK by a single unit step, or by a length of time equal to T/N.

The pulse width modulator 100 includes a data delay generator 104. The data delay generator 104 is coupled to the phase locked loop 102. The data delay generator 104 receives each of the phase signals $P_0$-$P_{N-1}$ from the phase locked loop 102. The data delay generator 104 also receives a data input signal. The data input signal indicates that data has been received and that the pulse width modulator 100 should generate an output pulse corresponding to the value of the data signal that has been received and the value of the phase select signal $PS_{<k:0>}$, as will be described in more detail below. In one embodiment, DATA IN may simply be an indicator that data has been received. The pulse width modulator may receive the actual data value separately.

The data delay generator 104 generates N data delay signals $D_0$-$D_{N-1}$. Each data delay signal $D_0$-$D_{N-1}$ is associated with a respective phase signal. The data delay signal $D_0$ is associated with the phase signal $P_0$. The data delay signal $P_1$ is associated with the phase signal $P_1$. The data delay signal $D_{N-1}$ is associated with the phase signal $P_{N-1}$.

The data delay generator 104 outputs the data delay signals with a timing based on the clock signal CLK, the phase signals, and the data input signal. In particular, when the data delay generator 104 receives the data input signal which is in sync with the rising edge of the clock signal, the data delay generator begins outputting the data delay signals upon the next rising edge of the clock signal CLK. Each data delay signal has a rising edge that is delayed from the rising edge of the clock signal by the value of the delay of the phase signal with which the data delay signal is associated. For example, when a data input signal is received, at the next rising edge of the clock signal the data delay generator will output the data delay signal $D_0$. The rising edge of the data delay signal $D_0$ coincides with the rising edge of the clock signal CLK because the phase signal $P_0$ with which the data delay signal $D_0$ is associated is in sync with the clock signal CLK. The rising edge of the data delay signal $D_1$ is delayed from the rising edge of the clock signal by a single unit step because the phase signal $P_1$ associated with the data delay signal $D_1$ is delayed from the clock signal by a single unit step. The rising edge of the data delay signal $D_{N-1}$ is delayed from the rising edge of the clock signal by N−1 unit steps because the associated phase signal $P_{N-1}$ is delayed from the clock signal by N−1 unit steps.

The pulse width modulator 100 includes a multiplexer 106. The multiplexer 106 is coupled to the data delay generator 104. In particular, the multiplexer 106 receives each of the data delay signals $D_0$-$D_{N-1}$ from the data delay generator 104. The multiplexer 106 outputs a data output pulse having a width corresponding to the value of the data associated with the data input signal.

The multiplexer 106 receives a phase select signal $PS_{<k:0>}$, or various selection signals generated from the phase select signal by selection logic not shown in FIG. 1A. The phase select signal $PS_{<k:0>}$ is a data signal that selects or controls the width of the output data pulse from the multiplexer 106. The phase select signal has k+1 bits, where $k=\log_2(N)-1$. The phase select signal includes information that causes the multiplexer to select input data delay signals to be provided at the output of the multiplexer. In this way, the phase select signal $PS_{<k:0>}$ controls the width of the output data pulse.

In one embodiment, the rising and falling edges of the data input signal are delayed by the amount represented by the decimal equivalent of the phase select signal $PS_{<k:0>}$ at that edge. Therefore, by varying the delays at the rising and falling edges of the data input, the output pulse width can be modulated.

Traditional multiplexers may not be able to output a data output pulse having a width corresponding to a single unit step. This is because the internal delay associated with a multiplexer may be larger than a single unit step. In traditional multiplexers, the result is that the minimum width of the output pulse is equal to the total delay of the multiplexer, which is longer than a single unit step.

The pulse width modulator 100 overcomes the drawbacks of traditional pulse width modulators by providing a multiplexer 106 that has identical delays for all data paths and that has a final stage that has a delay that is less than a single unit step. The multiplexer 106 of the pulse width modulator 100 includes high delay stages 108 and a low delay stage 110. The high delay stages 108 are in parallel with each other and collectively receive all of the data delay signals $D_0$-$D_{N-1}$ from the data delay generator 104.

In one example, the high delay stages 108 include a first high delay stage and a second high delay stage. The first high delay stage receives half of the data delay signals. The second high delay stage receives the other half of the data delay signals. The first and second high delay stages are in parallel with each other and are identical to each other. This means that the first and second high delay stages of the high delay stages 108 have identical delays. The first high delay stage outputs a first midpoint signal. The second high delay stage outputs a second midpoint signal. The first and second midpoint signals correspond to the respective data delay signal being output by the high delay stages.

The low delay stage 110 receives first midpoint signal and the second midpoint signal. In one example, the first midpoint signal controls the rising edge of the data output signal and the second midpoint signal controls the falling edge of the data output signal. However, either of the midpoint signals can control either edge of the data output signal, depending on the particular situation. The low delay stage has a delay that is smaller than a single unit step. The low delay stage 110 outputs a data pulse that has a delay smaller than a single unit step and is thus able to output the data pulses with a width of a single unit step, if the data value calls for such a small pulse.

Figure 1B:
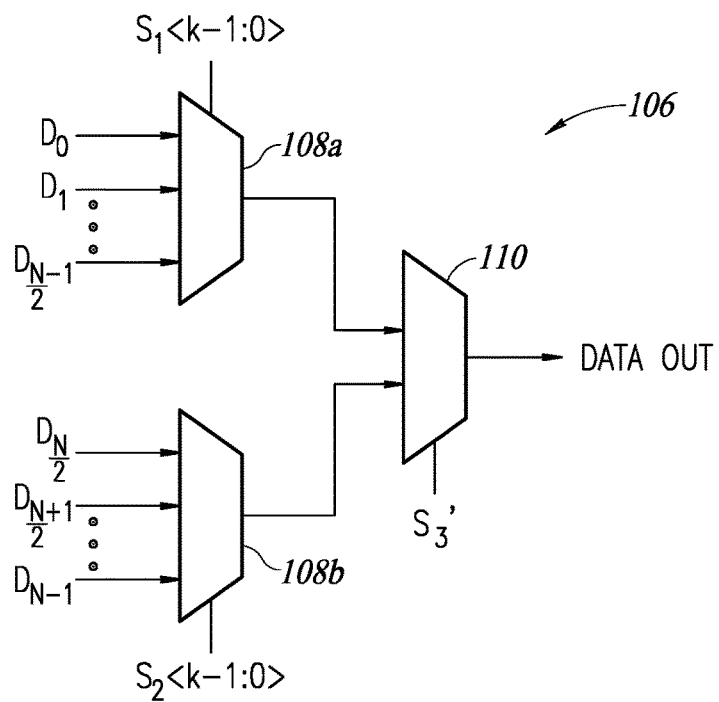
FIG. 1B is a schematic diagram of a multiplexer of the pulse width modulator of FIG. 1A, according to one embodiment.

FIG. 1B is a schematic diagram of the multiplexer 106 of FIG. 1A, according to one embodiment. The multiplexer 106 includes a first high delay stage 108a and a second high delay stage 108b. The first high delay stage 108a receives the data signals $D_0$-$D_{N/2-1}$. The second high delay stage 108b receives the data delay signals $D_{N/2}$-$D_{N-1}$. Accordingly, each of the first and second high delay stages receives half of the data delay signals.

The first high delay stage 108a receives a selection signal $S_{1<k-1:0>}$. The selection signal $S_{1<k-1:0>}$ determines the data delay signal that will be output from the high delay multiplexer 108a. In the example of FIG. 1B, the selection signal $S_{1<k-1:0>}$ is latched to the phase signal $P_{3N/4}$. This means that the first high delay stage 108a can output a data delay signal after the next rising edge of the phase signal $P_{3N/4}$. The selection signal $S_{1<k-1:0>}$ has k bits because it can select from N/2 possible data delay signals.

The second high delay stage 108b receives a selection signal $S_{2<k-1:0>}$. The selection signal $S_{2<k-1:0>}$ determines the data delay signal that will be output from the high delay stage 108b. In the example of FIG. 1B, the selection signal $S_{2<3:0>}$ is latched to the phase signal $P_{N/4}$. This means that the second high delay stage 108b can output a data delay signal after the next rising edge of the phase signal $P_{N/4}$.

The low delay stage 110 receives the midpoint signals from the first and second high delay stages 108a, 108b. The low delay stage 110 outputs a data output pulse having a width that represents a data value associated with the data input signal. The low delay stage 110 receives a selection signal $S_{3'}$. The selection signal $S_{3'}$ is the generated signal $S_3$ with the added delay of the multiplexer. The selection signal $S_3$ is latched to the phase signal $P_{N-1}$. The rising and falling edges of the data can be triggered by either the first or second midpoint signal based on the polarity of $S_{3'}$.

Figure 2A:
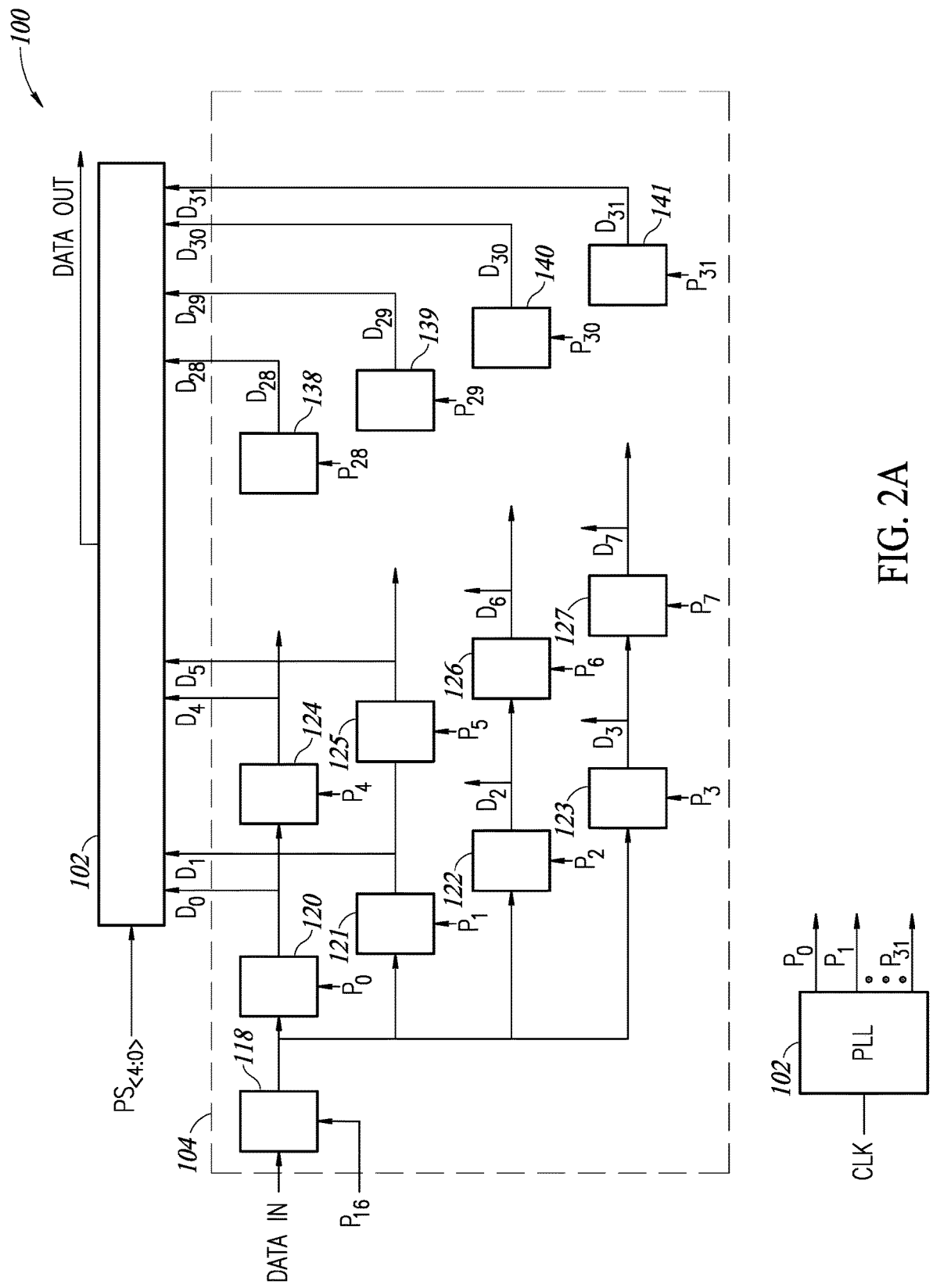
FIG. 2A is a schematic diagram of a pulse width modulator, according to one embodiment.

FIG. 2A is a block diagram of a pulse width modulator 100, according to one embodiment. The pulse width modulator 100 includes a phase locked loop 102. The phase locked loop 102 receives the clock signal and generates 32 phase signals $P_0$-$P_{31}$ substantially as described in relation to the phase locked loop 102 of FIG. 1. In the example of FIG. 2A, N=32. The first phase signal $P_0$ has no delay relative to the clock signal CLK. The second phase signal $P_1$ is delayed from the clock signal CLK by one unit step or 1/32 of the period T of the clock signal. The phase signal $P_{31}$ is delayed from the clock signal CLK by 31 unit steps, or 31/32 of the period T of the clock signal CLK.

The pulse width modulator 100 includes a data delay generator 104. The data delay generator 104 generates 32 data delay signals $D_0$-$D_{31}$. Each data delay signal $D_0$-$D_{31}$ is associated with a respective phase signal, substantially as described in relation to FIG. 1A. The data delay generator 104 also receives a data input signal (DATA IN). The data input signal indicates that data has been received and that the pulse width modulator 100 should generate an output pulse corresponding to the value of the data signal that has been received. A phase select signal $PS_{<4:0>}$ determines the amount of delay to be added at the DATA IN edge, as will be described in more detail below. Both the data input signal and $PS_{<4:0>}$ are synchronous to the rising edge of the clock signal CLK. While FIG. 2A illustrates the phase select signal $PS_{<4:0>}$ as being received by the multiplexer 102, in practice the phase select signal may be received by selection logic 150 that generates selection signals $S1_{<3:0>}$, $S_{2<3:0>}$, and $S_3$ based on the phase select signal $PS_{<4:0>}$.

The data delay generator 104 outputs the data delay signals with a timing based on the clock signal CLK, the phase signals, and the data input signal. In particular, when the data delay generator 104 receives the data input signal, the data delay generator begins outputting the data delay signals upon the next rising edge of the clock signal CLK. Each data delay signal has a rising edge that is delayed from the rising edge of the clock signal by the value of the delay of the phase signal with which the data delay signal is associated. For example, when a data input signal is received, at the next rising edge of the clock signal, the data delay generator will output the data delay signal $D_0$. The rising edge of the data delay signal $D_0$ coincides with the rising edge of the clock signal CLK because the phase signal $P_0$ with which the data delay signal $D_0$ is associated is in sync with the clock signal CLK. The rising edge of the data delay signal $D_1$ is delayed from the rising edge of the clock signal by a single unit step because the phase signal $P_1$ associated with the data delay signal $D_1$ is delayed from the clock signal by a single unit step. The rising edge of the data delay signal $D_{31}$ is delayed from the rising edge of the clock signal by 31 unit steps because the associated phase signal $P_{31}$ is delayed from the clock signal by 31 unit steps.

The data delay circuit 104 includes a plurality of flip-flops. A first flip-flop 118 receives the data input signal on a data input terminal. The flip-flop 118 receives the phase signal $P_{16}$ on a clock input terminal. The flip-flop 120, the flip-flop 121, the flip-flop 122, and the flip-flop 123 each receive on their data input terminals, the output of the flip-flop 118. The flip-flop 120 receives the phase signal $P_0$ as a clock signal and generates the corresponding data delay signal $D_0$. The flip-flop 121 receives the phase signal $P_1$ as a clock signal and generates the corresponding data delay signal $D_1$. The flip-flop 122 receives the phase signal $P_2$ as a clock signal and outputs the corresponding data delay signal $D_2$. The flip-flop 123 receives the phase signal P3 as a clock signal and outputs the corresponding data delay signal D3.

The flip-flops 124, 125, 126, and 127 receive on the data input terminals the outputs of the flip-flops 120, 121, 122, and 123 respectively. The flip-flops 124, 125, 126, and 127 receive as clock signals, phase signals $P_{4-7}$, respectively, and output corresponding data delay signals $D_{4-7}$, respectively. The flip-flops 138, 139, 140, and 141 receive as clock signals phase signals $P_{28}$-$P_{31}$, respectively, and output data delay signals $D_{28}$-$D_{31}$, respectively.

The flip-flops associated with data delay signals $D_8$-$D_{27}$ are not shown in FIG. 2A, but they are present in the circuit and their function can be understood in relation to the flip-flop shown in FIG. 2A. Though not shown in FIG. 2A, the flip flops associated with the phase signals $P_8$, $P_{12}$, $P_{16}$, $P_{20}$, and $P_{24}$ are connected in series between the flip slops 124 and 138 and output corresponding data signals $D_8$, $D_{12}$, $D_{16}$, $D_{20}$, and $D_{24}$ to the multiplexer 106. Though not shown in FIG. 2A, the flip flops associated with the phase signals $P_9$, $P_{13}$, $P_{17}$, $P_{21}$, and $P_{25}$ are connected in series between the flip-flops 125 and 139 and output corresponding data signals $D_9$, $D_{13}$, $D_{17}$, $D_{21}$, and $D_{25}$ to the multiplexer 106. Though not shown in FIG. 2A, the flip flops associated with the phase signals $P_{10}$, $P_{14}$, $P_{18}$, $P_{22}$, and $P_{26}$ are connected in series between the flip slops 126 and 140 and output corresponding data signals $D_{10}$, $D_{14}$, $D_{18}$, $D_{22}$, and $D_{26}$ to the multiplexer 106. Though not shown in FIG. 2A, the flip flops associated with the phase signals $P_{11}$, $P_{15}$, $P_{19}$, $P_{23}$, and $P_{27}$ are connected in series between the flip slops 127 and 141 and output corresponding data signals $D_{11}$, $D_{15}$, $D_{19}$, $D_{23}$, and $D_{27}$ to the multiplexer 106. In the context above, the flip flops connected "in series" means that the data output terminal of one flip flop is connected to the data input terminal of the next flip flop, though they have different clock inputs. The multiplexer 106 receives all of the data delay signals $D_0$-$D_{31}$.

Figure 2B:
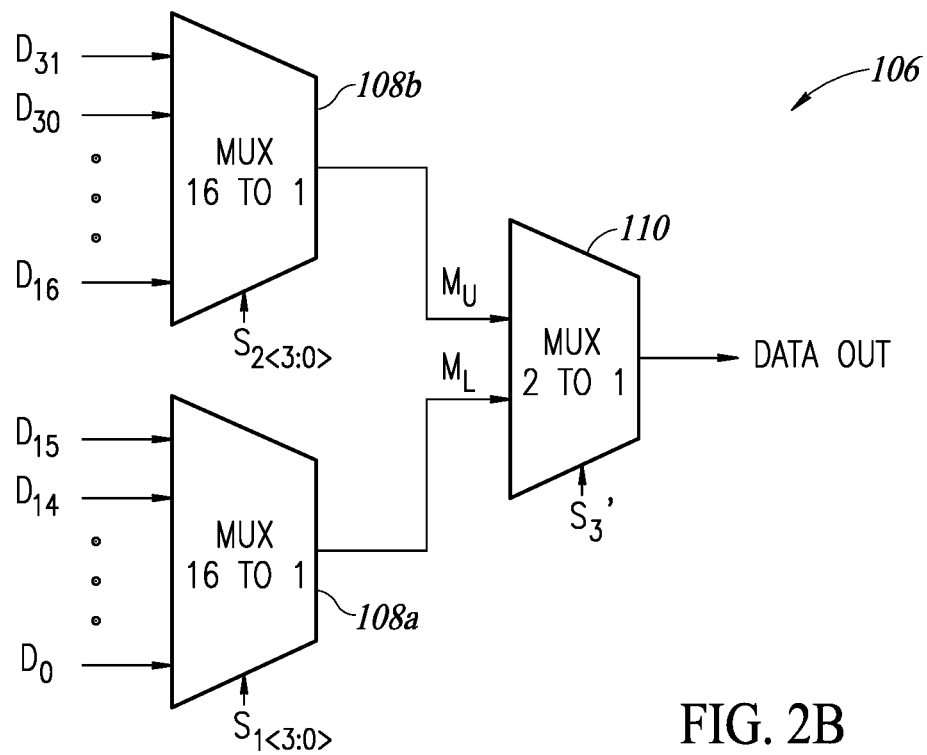
FIG. 2B is a schematic diagram of a multiplexer of the pulse width modulator of FIG. 2A, according to one embodiment.

FIG. 2B is a schematic diagram of the multiplexer 106 of FIG. 2A, according to one embodiment. The multiplexer 106 includes a first high delay stage 108a and a second high delay stage 108b. The first high delay stage 108a receives the data signals $D_0$-$D_{15}$. The second high delay stage 108b receives the data delay signals $D_{16}$-$D_{31}$. Accordingly, each of the first and second high delay stages receives half of the data delay signals.

The first high delay stage 108a receives a selection signal $S_{1<3:0>}$. The selection signal $S_{1<3:0>}$ is a four bit input signal $S_{1<3:0>}$. The selection signal $S_{1<3:0>}$ determines the data delay signal that will be output from the high delay multiplexer 108a. In the example of FIG. 2B, the selection signal $S_{1<3:0>}$ is latched to the phase signal $P_{24}$ as all of the inputs to the first high delay stage 108a are on the same value at this time and hence no glitches will occur when $S_{1<3:0>}$ switches. This means that the first high delay stage 108a can output a data delay signal after the next rising edge of the phase signal $P_{24}$. In general, it is beneficial for the selection signal $S_{1<3:0>}$ to be latched to a phase signal associated with the group of data signals received by the second high delay stage 108b. In one embodiment, it is particularly beneficial for the selection signal $S_{1<3:0>}$ to be latched to the phase signal $P_{3N/4}$, or in the case where N=32, $P_{24}$.

The second high delay stage 108b receives a selection signal $S_{2<3:0>}$. The selection signal $S_{2<3:0>}$ is a four bit input signal $S_{2<3:0>}$. The selection signal $S_{2<3:0>}$ determines the data delay signal that will be output from the high delay stage 108b. In the example of FIG. 1B, the selection signal $S_{2<3:0>}$ is latched to the phase signal $P_8$ as all of the inputs to the second high delay stage 108b are on the same value at this time and hence no glitches will occur when $S_{2<3:0>}$ switches. This means that the second high delay stage 108b can output a data delay signal after the next rising edge of the phase signal $P_8$. In general, it is beneficial for the selection signal $S_{2<3:0>}$ to be latched to a phase signal associated with the group of data signals received by the first high delay stage 108a. In one embodiment, it is particularly beneficial for the selection signal $S_{2<3:0>}$ to be latched to the phase signal $P_{N/4}$, or in the case where N=32, $P_8$.

The first high delay stage 108a outputs a midpoint signal $M_U$. $M_U$ corresponds to the data delay signal selected by $S_{1<3:0>}$. The second high delay stage 108b outputs a midpoint signal $M_L$. $M_L$ corresponds to the data delay signal selected by $S_{2<3:0>}$.

The low delay stage 110 receives the midpoint signals $M_U$, $M_L$ from the first and second high delay stages 108a, 108b. The low delay stage 110 outputs a data output pulse having a width that represents a data value associated with the data input signal. The low delay stage 110 receives a selection signal $S_{3'}$. The selection signal $S_{3'}$ is latched to the phase signal $P_{31}$. The rising edge of the data output pulse may be triggered by the edge of either the midpoint signal $M_U$ output by the first high delay stage 108a or the edge of the midpoint signal $M_L$. The falling edge of the data output pulse may be triggered by the edge of either the midpoint signal $M_L$ output by the second high delay stage 108b or the edge of the midpoint signal $M_U$ output by the first high delay stage 108a.

Figure 2C:
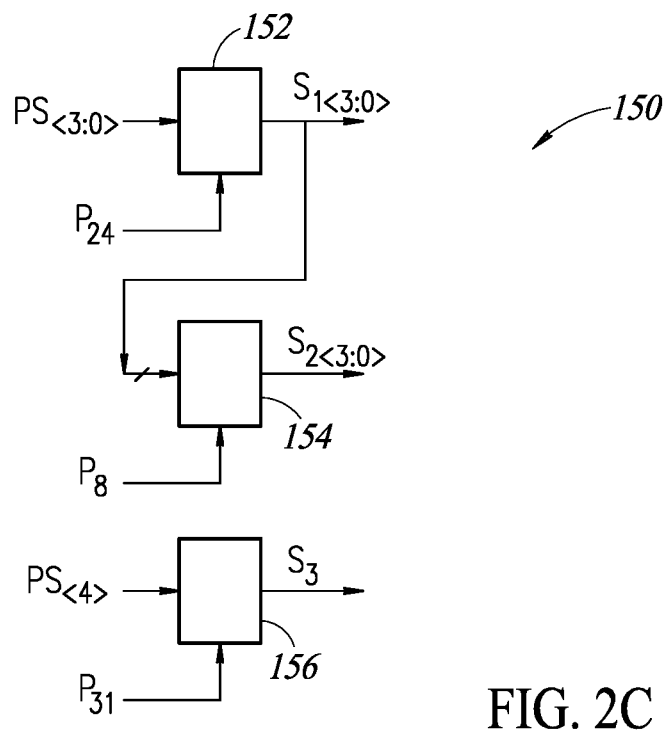
FIG. 2C is a schematic diagram of selection logic of the pulse width modulator of FIG. 2A, according to one embodiment.

FIG. 2C is a block diagram of selection logic 150, according to one embodiment. The selection logic 150 generates the selection signals $S_{1<3:0>}$, $S_{2<3:0>}$, and $S_3$. A flip-flop 152 receives a phase select signal $PS_{<3:0>}$ on a data input terminal and the phase signal $P_{24}$ on the clock input terminal and outputs the selection signal $S_{1<3:0>}$. While a signal flip flop 152 is illustrated in FIG. 2C, in practice there are four flip flops 152 that each receive a respective bit of the phase select signal $PS_{<3:0>}$ on the data input terminal and the phase signal $P_{24}$ the clock input terminal. The selection signal $S_{1<3:0>}$ is a four bit signal with each bit being supplied by one of the four flip flops 152.

A second flip-flop 154 receives the selection signal $S_{1<3:0>}$ on a data input terminal and the phase signal $P_8$ on the clock input terminal and outputs the selection signal $S_{2<3:0>}$. While a signal flip flop 154 is illustrated in FIG. 2C, in practice there are four flip flops 154 that each receive a respective bit of the selection signal $S_{1<3:0>}$ on the data input terminal and the phase signal $P_8$ the clock input terminal. The selection signal $S_{2<3:0>}$ is a four bit signal with each bit being supplied by one of the four flip flops 152.

A third flip-flop 156 receives the phase select signal $PS_{<4>}$ on the data input terminal and the phase signal $P_{31}$ on the clock input terminal and outputs the selection signal $S_3$. Accordingly, the third flip-flop samples $PS_{<4>}$ at the rising edge of P31 and outputs the selection signal $S_3$. The selection signal $S_{3'}$ is generated from $S_3$ by adding a delay value to $S_3$, as will be explained in more detail below.

The phase select signals $PS_{<3:0>}$ and $PS_{<4>}$ indicate the data delay signals to be utilized in generating the data output pulse. The selection signals $S_{1<3:0>}$, $S_{2<3:0>}$, and $S_3$ are provided to the multiplexer 106.

Figure 2D:
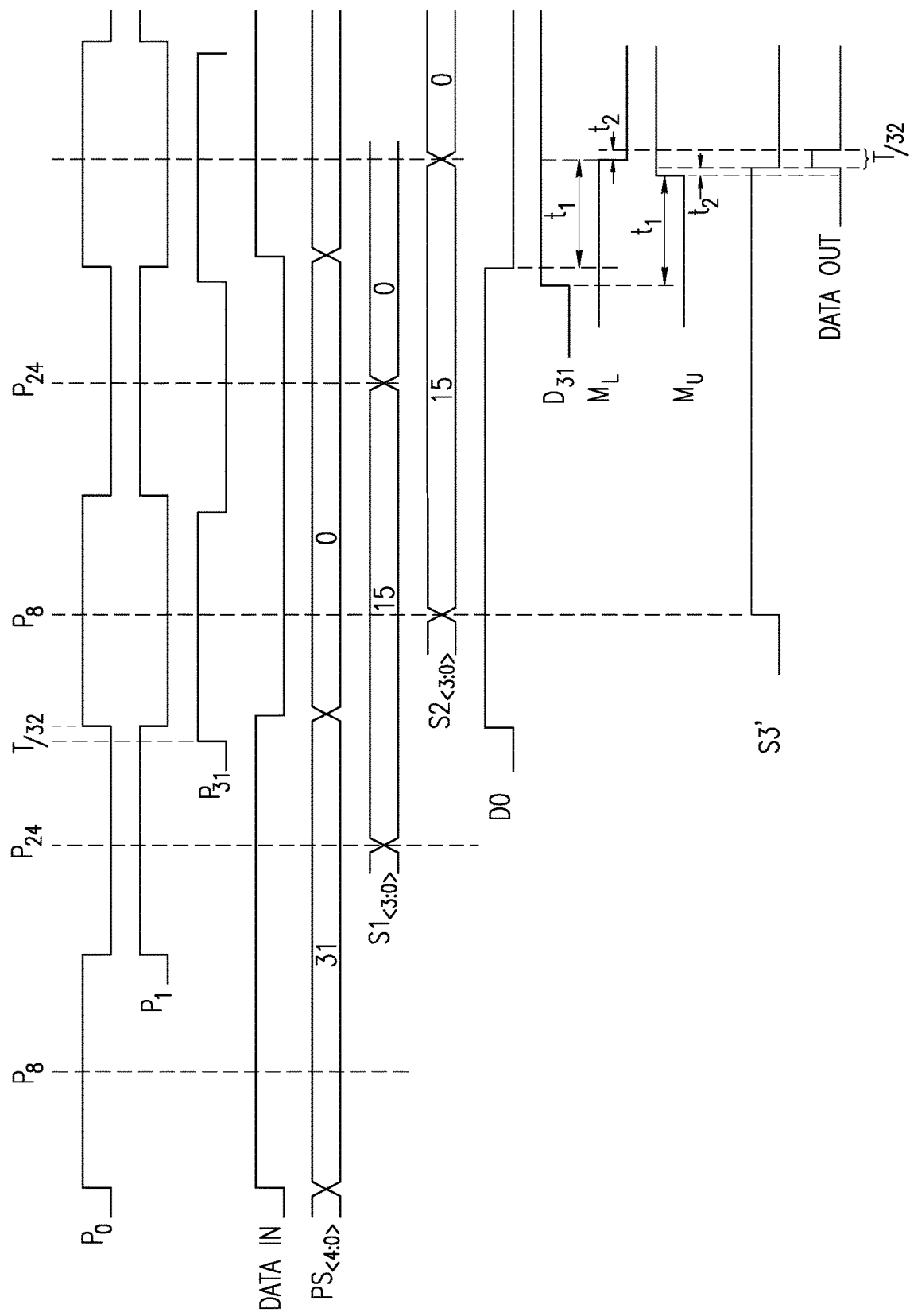
FIG. 2D is a timing diagram of signals associated with the pulse width modulator of FIG. 2A, according to one embodiment.

FIG. 2D is an example of a timing diagram of signals associated with the pulse width modulator 100 of FIGS. 2A-2C, according to one embodiment. FIG. 2B illustrates the phase signal $P_0$, the phase signal $P_{16}$, and the phase signal $P_{31}$. The phase signal $P_0$ is aligned with the clock signal CLK. The phase signal $P_{16}$ is offset by 16 unit steps from the phase signal $P_0$. The rising edge of the phase signal $P_{16}$ occurs at the falling edge of the phase signal $P_0$. The phase signal $P_{31}$ is 31 unit steps delayed from the phase signal $P_0$. Accordingly, the rising edge of the phase signal $P_{31}$ occurs 31 unit steps after the rising edge of the phase signal $P_0$. FIG. 2D also illustrates the locations of the rising edges of the phase signals $P_8$ and $P_{24}$ in dashed lines.

FIG. 2D illustrates that a data input signal (DATA IN) is received slightly after the rising edge of the phase signal $P_0$ (also the clock signal CLK). The phase select signal $PS_{<4:0>}$ has transitions at the rising and falling edges of the data input signal. The selection signal $S_{1<3:0>}$ is latched to the phase signal $P_{24}$ and accordingly has transitions on the rising edges of $P_{24}$. The selection signal $S_{2<3:0>}$ is latched to the phase signal $P_8$ and accordingly has transitions on the rising edges of $P_8$.

The phase select signal $PS_{<4:0>}$ initially has a binary value equivalent to 31. This means that the rising edge of the data output signal should be delayed 31 unit steps from the data input signal, plus a clock cycle. The selection logic 150 unpacks the phase select signal $PS_{<4:0>}$ and generates the selection signal $S_{1<3:0>}$. The phase select signal $PS_{<4:0>}$ with a binary value equivalent to the decimal value 31 results in a selection signal $S_{1<3:0>}$ with a binary value equivalent to the decimal value 15. The selection signal $S_{1<3:0>}$ assumes the value 15 upon the rising edge of the phase signal $P_{24}$. At the falling edge of the data input signal, the phase select signal $PS_{<4:0>}$ takes on the binary value equivalent to 0. After $S_{1<3:0>}$ takes on the value 15, the selection signal $S_{2<3:0>}$ is generated by sampling $S_{1<3:0>}$ at the rising edge of the phase signal $P_8$. Accordingly, $S_{2<3:0>}$ takes on the binary value equivalent to 15 at the rising edge of $P_8$.

The data delay signal $D_{31}$ goes high 31 unit steps plus one clock cycle after the data input signal DATA IN initially goes high. The selection signal $S2_{<3:0>}$ with a value of 15 causes the second high delay multiplexer stage 108b to select the data delay signal $D_{31}$ as output. The rising edge of $D_{31}$ causes $M_U$ to transition from low to high after a delay of t1, where t1 the relatively high internal delay of the second high delay multiplexer stage 108b.

$S_{1<3:0>}$ transitions from 15 to 0 because the $S_{1<3:0>}$ selection logic (the flip flops 152) sample $PS_{<3:0>}$ at the next rising edge of $P_{24}$. With $S_{1<3:0>}$ at the value 0, the first high delay multiplexer stage 108a selects the data delay signal $D_0$ to be supplied at the output. The value of $D_0$ is high at this transition point, so the value of $M_L$ is initially shown as high. The falling edge of $D_0$ causes $M_L$ to transition from high to low after a delay of t1, where t1 is the relatively high internal delay of the first high delay stage 108a. The first and second high delay multiplexer stages 108a and 108b have identical internal delays of t1.

The selection signal $S_{3'}$ controls the low delay multiplexer stage 108c. The selection signal $S_{3'}$ is based on the selection signal S3. The selection signal S3 is generated by sampling $PS_{<4:0>}$ at the rising edge of $P_{31}$. This causes S3 to go high at the first rising edge of $P_{31}$. S3' is equivalent to S3 plus the entire delay of the multiplexer 102. The delay of the multiplexer 102 is equivalent to t1+t2. Accordingly, S3' goes high at the rising edge of P31 after a delay of t1+t2. One purpose of this delay is to ensure that the falling edge of S3' will occur between the rising edge of $M_U$ and the falling edge of $M_L$. The falling edge of S3' occurs between the rising edge of $M_U$ and the falling edge of $M_L$.

While S3', the low delay multiplexer stage selects the output $M_U$ of the low delay multiplexer stage 108b. The rising edge of $M_U$ causes DATA OUT to go high after a delay of t2, where t2 is the internal delay of the low delay multiplexer stage 108c. Shortly after the rising edge of $M_U$, S3' goes low, causing the low delay multiplexer stage 108c to select the output $M_L$ of the high delay multiplexer stage 108a. $M_L$ is initially high so DATA OUT remains high until the falling edge of $M_L$. The falling edge of $M_L$ causes DATA OUT to go low after the delay of t2. The width of the output data pulse is a single unit step. This is possible, in part, because t2 is smaller than a single unit step.

As can be seen in FIG. 2D, the delay $t_1$ of the high delay multiplexer stages 108a and 108b is much larger than a single unit step. However, the delay $t_2$ of the low delay multiplexer stage 110 of the multiplexer 106 is much smaller than a single unit step. Because the high delay multiplexer stages 108a and 108b have the same delay $t_1$ and the low delay final multiplexer stage has a delay $t_2$ smaller than a single unit step, the multiplexer 106 is able to output a data pulse with the width of a single unit step.

The multiplexer 102 is capable of outputting data output pulses with widths corresponding to any number of unit steps between 1 and 32. The values of the phase select signal $PS_{<4:0>}$ determine the width of the output data pulse. Many other signal schemes can be utilized in according with principles of the present disclosure without departing from the scope of the present disclosure.

Figure 3:
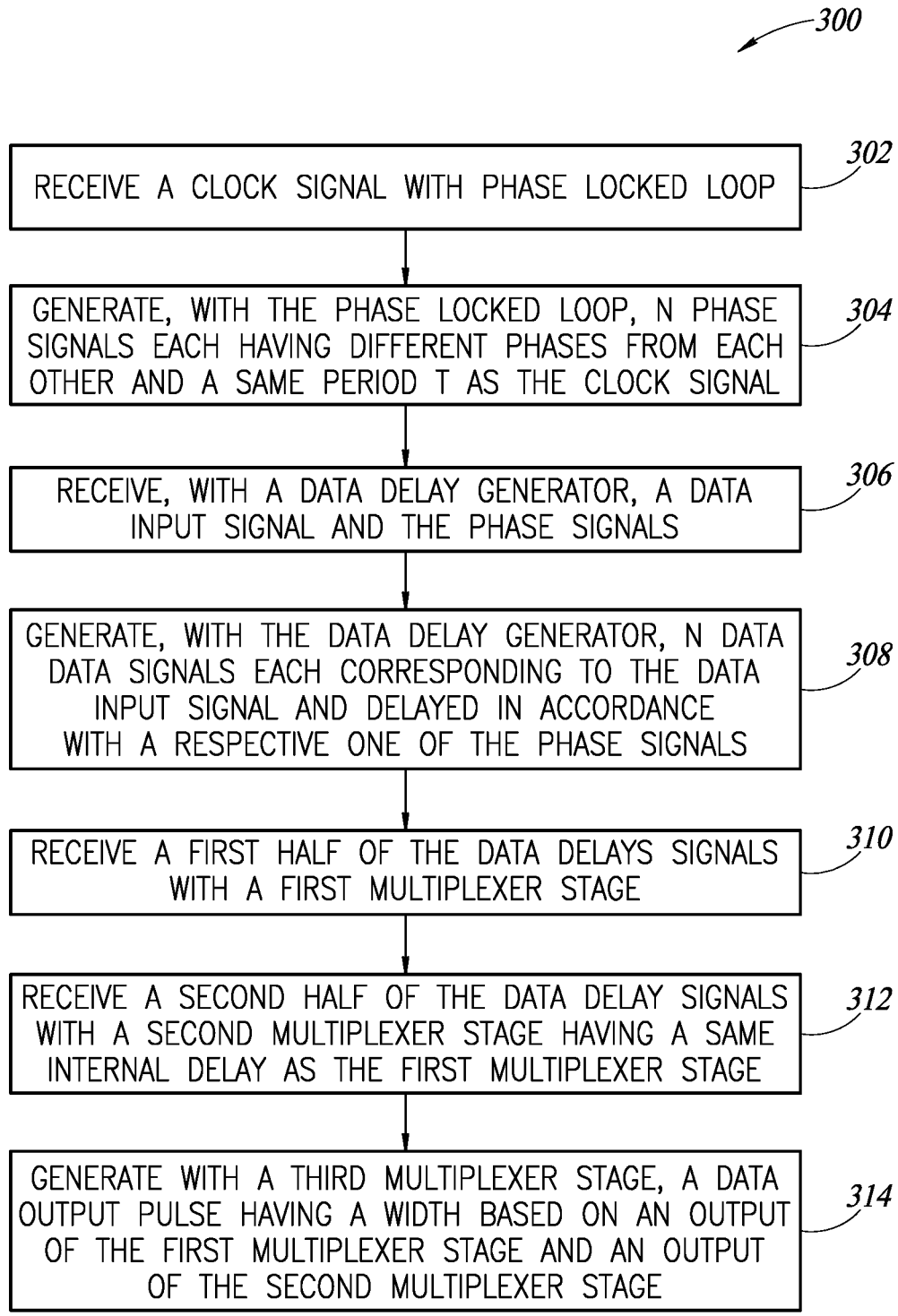
FIG. 3 is a flow diagram of a method for generating data pulses, according to one embodiment.

FIG. 3 is a flow diagram of a method 300 for operating a pulse width modulator, according to one embodiment. At 302, the method 300 includes receiving a clock signal with a phase locked loop. At 304, the method 300 includes generating, with the phase locked loop, N phase signals each having different phases from each other and a same period T as the clock signal. At 306, the method 300 includes receiving, with a data delay generator, a data input signal and the phase signals. At 308, the method 300 includes generating, with the data delay generator, N data delay signals each corresponding to the data input signal and delayed in accordance with a respective one of the phase signals. At 310, the method 300 includes receiving a first half of the data delay signals with a first multiplexer stage. At 312, the method 300 includes receiving a second half of the data delay signals with a second multiplexer stage having a same internal delay as the first multiplexer stage. At 314, the method 300 includes generating, with a third multiplexer stage, a data output pulse having a width based on an output of the first multiplexer stage and an output of the second multiplexer stage.

In one embodiment, a pulse width modulator includes a phase locked loop configured to receive a clock signal and to output N phase signals and a data delay generator configured to receive the phase signals and a data input signal and to output N data delay signals each corresponding to the data input signal and delayed in accordance with a respective one of the phase signals. The pulse width modulator includes a multiplexer having a first multiplexer stage configured to receive a first half of the data delay signals and to output a first midpoint signal, a second multiplexer stage in parallel with the first multiplexer stage and configured to receive a second half of the data delay signals and to output a second midpoint signal, and a third multiplexer stage configured to receive the first midpoint signal and the second midpoint signal and to output a data output pulse based on the first and second midpoint signals.

In one embodiment, a method includes receiving a clock signal with a phase locked loop, generating, with the phase locked loop, N phase signals each having different phases from each other and a same period T as the clock signal, and receiving, with a data delay generator, a data input signal and the phase signals. The method includes generating, with the data delay generator, N data delay signals each corresponding to the data input signal and delayed in accordance with a respective one of the phase signals and receiving a first half of the data delay signals with a first multiplexer stage. The method includes receiving a second half of the data delay signals with a second multiplexer stage having a same internal delay as the first multiplexer stage and generating, with a third multiplexer stage, a data output pulse having a width based on an output of the first multiplexer stage and an output of the second multiplexer stage.

In one embodiment, a pulse width modulator includes a phase locked loop configured to receive a clock signal having a period T and to generate N phase signals each having the period T of the clock signal and each offset in time from the clock signal by a respective integer number of unit steps. A unit step is a period of time equal to T/N. The pulse width modulator includes a data delay generator configured to receive a data input signal and to generate, for each phase signal, a respective data delay signal corresponding to the data input signal delayed in accordance with the phase signal. The pulse width modulator includes a first multiplexer stage configured to receive, as inputs, a first group of N/2 of the data delay signals, a second multiplexer stage configured to receive, as inputs, a second group of N/2 of the data delay signals distinct from the first group, and a third multiplexer stage configured to receive, as inputs, an output of the first multiplexer and an output of the second multiplexer, and to provide a data pulse having a width based on the output of the first multiplexer stage and the output of the second multiplexer stage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pulse width modulator, comprising:
   a phase locked loop configured to receive a clock signal and to output N phase signals;
   a data delay generator configured to receive the phase signals and a data input signal and to output N data delay signals each corresponding to the data input signal and delayed in accordance with a respective one of the phase signals; and
   a multiplexer configured to receive the N data delay signals, a first selection signal, and a second selection signal and to output a data pulse based on the first and second selection signals.

2. The pulse width modulator of claim 1, wherein the multiplexer includes:
   a first multiplexer stage configured to receive a first half of the data delay signals and to output a first midpoint signal based on the first selection signal;
   a second multiplexer stage configured to receive a second half of the data delay signals and to output a second midpoint signal based on the second selection signal.

3. The pulse width modulator of claim 2, wherein the multiplexer includes a third multiplexer stage configured to receive the first midpoint signal and the second midpoint signal and to output a data output pulse based on the first and second midpoint signals and the third selection signal.

4. The pulse width modulator of claim 3, wherein the clock signal has a period T, wherein the third multiplexer stage is configured to output the data output pulse with a width equal to T/N.

5. The pulse width modulator of claim 4, wherein the first and second multiplexer stages have identical internal delays.

6. The pulse width modulator of claim 5, wherein the third multiplexer stage has an internal delay less than the internal delay of the first and second multiplexer stages.

7. The pulse width modulator of claim 5, wherein the third multiplexer stage has an internal delay less than T/N.

8. The pulse width modulator of claim 7, wherein the first multiplexer stage receives the first selection signal locked to one of the phase signals having a delay equal to N*3/4 unit steps.

9. The pulse width modulator of claim 8, wherein the second multiplexer stage receives the second selection signal locked to one of the phase signals having a delay equal to N/4 unit steps.

10. The pulse width modulator of claim 9, wherein the third multiplexer stage receives the third selection signal lock to one of the phase signals having a delay equal to N−1 unit steps.

11. A method, comprising:
    receiving a clock signal with a phase locked loop;
    generating, with the phase locked loop, N phase signals each having different phases from each other and a same period T as the clock signal;
    receiving, with a data delay generator, a data input signal and the phase signals;
    generating, with the data delay generator, N data delay signals each corresponding to the data input signal and delayed in accordance with a respective one of the phase signals;
    receiving, with a multiplexer, the N data delay signals;
    receiving, with the multiplexer, a first selection signal, a second selection signal, and a third selection signal; and
    outputting, from the multiplexer, a data output pulse having a width based on the first, second, and third selection signals.

12. The method of claim 11, comprising:
    receiving a first half of the data delay signals and the first selection signal with a first multiplexer stage of the multiplexer;
    receiving a second half of the data delay signals and the second selection signal with a second multiplexer stage of the multiplexer, the second multiplexer stage having a same internal delay as the first multiplexer stage;
    receiving the third selection signal with a third multiplexer stage of the multiplexer; and
    generating, with the third multiplexer stage, a data output pulse having a width based on an output of the first multiplexer stage and an output of the second multiplexer stage and the third selection signal.

13. The method of claim 12, further comprising generating the data output pulse with a rising edge based on a rising or falling edge of the output of the first multiplexer stage or on a rising or falling edge of the output of the second multiplexer stage.

14. The method of claim 12, further comprising generating the data output pulse with a falling edge based on a rising or falling edge of the output of the first multiplexer stage or on a rising or falling edge of the output of the second multiplexer stage.

15. The method of claim 12, wherein a rising edge of the data output pulse is delayed from an edge of the output of one of the first multiplexer stage or the second multiplexer stage by an internal delay of the third multiplexer stage, wherein a falling edge of the data output pulse is delayed from an edge of the output of the other of the first multiplexer stage or the second multiplexer stage by the internal delay of the third multiplexer stage.

16. The method of claim 15, wherein the internal delay of the third multiplexer stage is less than T/N, where T is a period of the clock signal.

17. The method of claim 12, further comprising:
    controlling the first multiplexer stage with a first selection signal latched to one of the phase signals received by the second multiplexer; and
    controlling the second multiplexer stage with a second selected signal latched to one of the phase signals received by the first multiplexer, wherein the first and second selection signals are 180 degrees out of phase with each other.

18. A pulse width modulator, comprising:
    a phase locked loop configured to receive a clock signal having a period T and to generate N phase signals each having the period T of the clock signal and each offset in time from the clock signal by a respective integer number of unit steps, wherein a unit step is a period of time equal to T/N;
    a data delay generator configured to receive a data input signal and to generate, for each phase signal, a respective data delay signal corresponding to the data input signal delayed in accordance with the phase signal;
    a multiplexer configured to receive the data delay signals and a plurality of selection signals, wherein the multiplexer is configured output a data pulse having a rising edge triggered by a first selected data delay signal and a falling edge triggered by a second data delay signal based on the plurality of selection signals.

19. The pulse width modulator of claim 18, wherein the multiplexer includes:

a first multiplexer stage configured to receive a first group of N/2 of the data delay signals and a first selection signal of the plurality of selection signals;

a second multiplexer stage configured to receive a second selection signal of the plurality of selection signals a second group of N/2 of the data delay signals distinct from the first group; and a third multiplexer stage configured to receive, as inputs, an output of the first multiplexer and an output of the second multiplexer, and to provide the data pulse.

20. The pulse width modulator of claim 19, wherein the output of the first multiplexer stage is the first selected data delay signal, wherein the output of the second multiplexer is the second selected data delay signal.

* * * * *